(12) United States Patent
Rauch et al.

(10) Patent No.: US 7,077,918 B2
(45) Date of Patent: Jul. 18, 2006

(54) STRIPPING APPARATUS AND METHOD FOR REMOVAL OF COATINGS ON METAL SURFACES

(75) Inventors: Udo Michael Rauch, Schlins (AT); Wolfgang Kalss, Feldkirch (AT); Christian Wohlrab, Feldkirch (AT); Caroline Siebert, Mainz (DE); Norbert Froemel, Herrieden (DE)

(73) Assignee: Unaxis Balzers Ltd., Balzers (LI)

( * ) Notice: Subject to any disclaimer, the term of this patent is extended or adjusted under 35 U.S.C. 154(b) by 0 days.

(21) Appl. No.: 11/048,038

(22) Filed: Jan. 31, 2005

(65) Prior Publication Data
US 2005/0241679 A1 Nov. 3, 2005

Related U.S. Application Data

(60) Provisional application No. 60/629,522, filed on Nov. 19, 2004, provisional application No. 60/540,272, filed on Jan. 29, 2004.

(51) Int. Cl.
*B08B 3/04* (2006.01)
(52) U.S. Cl. .................. 134/42; 427/248.1; 427/249.1; 427/249.18; 427/250; 427/255.7; 427/404; 427/419.7; 134/2; 134/3; 134/29; 134/36
(58) Field of Classification Search ................ 427/250, 427/249.1, 249.18, 255.7, 404, 419.7, 248.1; 134/2, 3, 29, 36, 42
See application file for complete search history.

(56) References Cited

U.S. PATENT DOCUMENTS

| | | | | |
|---|---|---|---|---|
| 3,140,203 | A * | 7/1964 | Grunwald | 134/3 |
| 3,458,353 | A * | 7/1969 | Baldi | 134/3 |
| 3,833,414 | A * | 9/1974 | Grisik et al. | 216/53 |
| 4,089,736 | A * | 5/1978 | Fisher et al. | 216/103 |
| 4,282,041 | A * | 8/1981 | Cork | 134/3 |
| 4,592,852 | A * | 6/1986 | Courduvelis et al. | 252/79.1 |
| 5,052,421 | A * | 10/1991 | McMillen | 134/2 |
| 5,330,558 | A | 7/1994 | McCormick | 75/715 |
| 5,700,518 | A * | 12/1997 | Lee et al. | 427/249.12 |
| 6,468,439 | B1 * | 10/2002 | Whitehurst et al. | 216/95 |
| 6,494,960 | B1 * | 12/2002 | Macdonald et al. | 134/3 |
| 6,531,049 | B1 * | 3/2003 | Kariya et al. | 205/717 |
| 6,875,292 | B1 * | 4/2005 | Worthing et al. | 148/535 |
| 6,878,215 | B1 * | 4/2005 | Zimmerman, Jr. | 134/26 |
| 2001/0016273 | A1 * | 8/2001 | Narasimhan et al. | 428/698 |
| 2004/0037958 | A1 * | 2/2004 | Warnes et al. | 427/250 |

FOREIGN PATENT DOCUMENTS

| | | |
|---|---|---|
| DE | 972359 | 11/1982 |
| DE | 4339502 | 6/1995 |
| DE | 10150413 | 6/2002 |

(Continued)

OTHER PUBLICATIONS

Web page printed from http://hyperphysics.phy-astr.gsu.edu/hbase/chemical/ph.html at least as early as Jan. 2006.

*Primary Examiner*—Sharidan Carrillo
(74) *Attorney, Agent, or Firm*—Pearne & Gordon LLP

(57) ABSTRACT

A coating is stripped off a work piece by applying a chromous and aluminiforous coat directly on the work piece and stripping the work piece with an alkaline solution containing a strong oxidant. A single-compartment system can be used, which includes a spray chamber including a circulatory spray-cycle system; a support for holding the work piece; and a media container connected to the spray chamber via a media circulation system.

30 Claims, 1 Drawing Sheet

FOREIGN PATENT DOCUMENTS

| | | | |
|---|---|---|---|
| DE | 10229564 | | 1/2004 |
| EP | 0159221 | | 10/1985 |
| EP | 0922514 | | 10/1996 |
| EP | 1186681 | | 3/2002 |
| JP | 57104667 | | 12/1980 |
| JP | 59170264 | * | 9/1984 |
| JP | 02285081 | | 2/1991 |
| JP | 01292872 | * | 7/1991 |
| JP | 3320965 | | 10/1996 |
| JP | 08 325755 A | | 4/1997 |
| JP | 11256365 | * | 9/1999 |
| JP | 11256366 | * | 9/1999 |
| JP | 11256367 | * | 9/1999 |
| WO | 99/54528 | | 4/1998 |
| WO | 99/24642 | | 5/1999 |
| WO | 99/64646 | | 5/1999 |

* cited by examiner

STRIPPING APPARATUS AND METHOD FOR REMOVAL OF COATINGS ON METAL SURFACES

This application claims the benefit of U.S. Provisional Patent Application No. 60/540,272 filed on Jan. 29, 2004 and Provisional Patent Application No. 60/629,522 filed Nov. 19, 2004.

FIELD OF THE INVENTION

This invention relates to a method for stripping a coating and more specifically for the stripping of chromous and aluminiferous coatings.

BACKGROUND OF THE INVENTION

Stripping methods for the removal of coatings applied on metal surfaces for instance by electroplating or PVD or CVD processes have been described in prior art. For example, TiN coatings are easily dissolved using an aqueous hydrogen peroxide solution. However, in applications where more complex layers are to be removed, such as ternary or quaternary coatings whose mechanical and/or chemical properties make them particularly suitable for many applications in the tool and die industry and in mechanical engineering, more complex methods are typically required. For example, one method requires the use of a variety of chemicals some of which are expensive and/or environmentally or toxicologically unsafe. Another example is by use of electrolysis or similar process that requires electrical contact with the work piece. In many cases, these more complex methods require unacceptable processing times in the manufacturing industry.

JP 3320965 discloses a method for stripping TiAlN, ZrAlN, HfAlN as well as $Si_3N_4$ hard-material coatings. It employs alkaline solutions containing various concentrations of permanganate and dichromate ions. However, a satisfactory removal of the layers specified was not possible until relatively high dichromate concentrations along with a high pH value and temperatures above 40° C. were used or an electrolytic process was added. The fastest stripping times achieved were in the range from 1–5 hours. Yet dichromates are known to have a high toxic potential because of the hexavalent chromium, and their use as well as disposal requires special precautionary measures. Moreover, that method causes small pores to form in the substrate, intended to enhance the bonding of the coating. However, this is undesirable for polished substrates.

JP 02-285081 discloses a method for stripping chrome or chromium oxide coatings. The process involves an aqueous solution with the addition of a corrosive agent and an aromatic or fluoric tenside.

The German patent application DE 4339502 describes the nondestructive stripping of carbide substrates coated with among others TiAlN layers. The improvement over prior methods consists of, apart from the usual complexing agents and stabilizers, the use of anticorrosive inhibitors along with other process materials and adjusting the pH value of the solution which, in combination with the other reagents, prevents the separation of Co from the work piece. The drawbacks of that approach include the comparatively long stripping time for TiAlN and others, the relatively extensive and correspondingly expensive use of chemicals, the fairly complicated formulations and reaction conditions (that must be precisely observed), as well as the use of fluoric reagents.

WO9964646 describes a stripping method whereby a work piece is first coated with a thin TiN layer subsequently followed by the application of the hard-to-remove functional TiAlN layer. Stripping is performed using a hydrogen peroxide solution which, penetrating the pores in the cover layer, dissolves the intermediate TiN layer. The drawback of TiN coatings, however, is that they offer relatively low thermal stability compared for example to TiAlN or AlCrN. TiN coatings exposed to air develop a damaging oxidation process at temperatures as low as 600° C., which leads to the complete failure of the coating after a prolonged exposure. To remove the highly heat-resistant coatings after the detection of flaws in the manufacturing process or prior to the recoating of an expensive tool without damaging the delicate tool surfaces, a considerable number of stripping processes were developed, including complex and even electrolytic procedures like those mentioned in JP 3320965 or WO 1999-54528.

Thus, it is the objective of this invention to introduce a method for the stripping of hard coatings without the drawbacks of prior-art techniques. In particular, this method is intended to permit easy and rapid stripping using safe chemicals. Another objective of the present invention includes a stripping method for coatings that can also be used at extremely high operating and processing temperatures. For example, for TiAlN any oxidative damage would not occur at temperatures below approximately 800° C. However, the method lends itself particularly well to applications on AlCrN, $Al_2O_3$, $(AlCr)_2O_3$ or $(AlCr)_xO_yN_z$ layers where a failure of the coating or of the layer/substrate bond does not manifest itself until temperatures over 1000° C. are reached.

BRIEF SUMMARY OF THE INVENTION

In accordance with one aspect of the present invention a method for stripping a coating off a work piece to improve strippability is provided comprising the steps of applying at least a first chromous and aluminiferous coat directly on the work piece and stripping the work piece with an alkaline solution containing a strong oxidant.

In accordance with another aspect of the present invention a single-compartment system for applying a stripping method is provided comprising a means for applying at least a first chromous and aluminiferous coat directly on the work piece, a means for stripping the work piece with an alkaline solution containing a strong oxidant, a means for depositing the coating by a PVD or CVD process, a means for cleaning the work piece in an aqueous solution for the removal of any manganese dioxide residue that may have remained on the work piece surface, wherein the cleaning includes at least one pre-cleaning or one fine cleaning operation or a combination thereof, a means for rinsing the work piece, wherein the rinsing includes at least one alkaline rinse or at least one rinse with an anticorrosion agent; and a means for drying the work pieces.

In accordance with yet another aspect of the present invention a single-compartment system for applying a stripping method is provided comprising a spray chamber including a circulatory spray-cycle system, at least one support for holding at least one work piece, at least one, preferably at least two media containers connected to the spray chamber via a media circulation system, and a process control system to control the circulatory spray-cycle system, the media circulation system and all other devices.

Additional benefits and advantages of the present invention will become apparent to those skilled in the art to which it pertains upon a reading and understanding of the following detailed specification.

BRIEF DESCRIPTION OF THE DRAWINGS

The invention may take physical form in certain parts and arrangement of parts, a preferred embodiment of which will be described in detail in this specification and illustrated in the accompanying drawings that form a part of the specification.

DETAILED DESCRIPTION OF THE INVENTION

Figure 1:
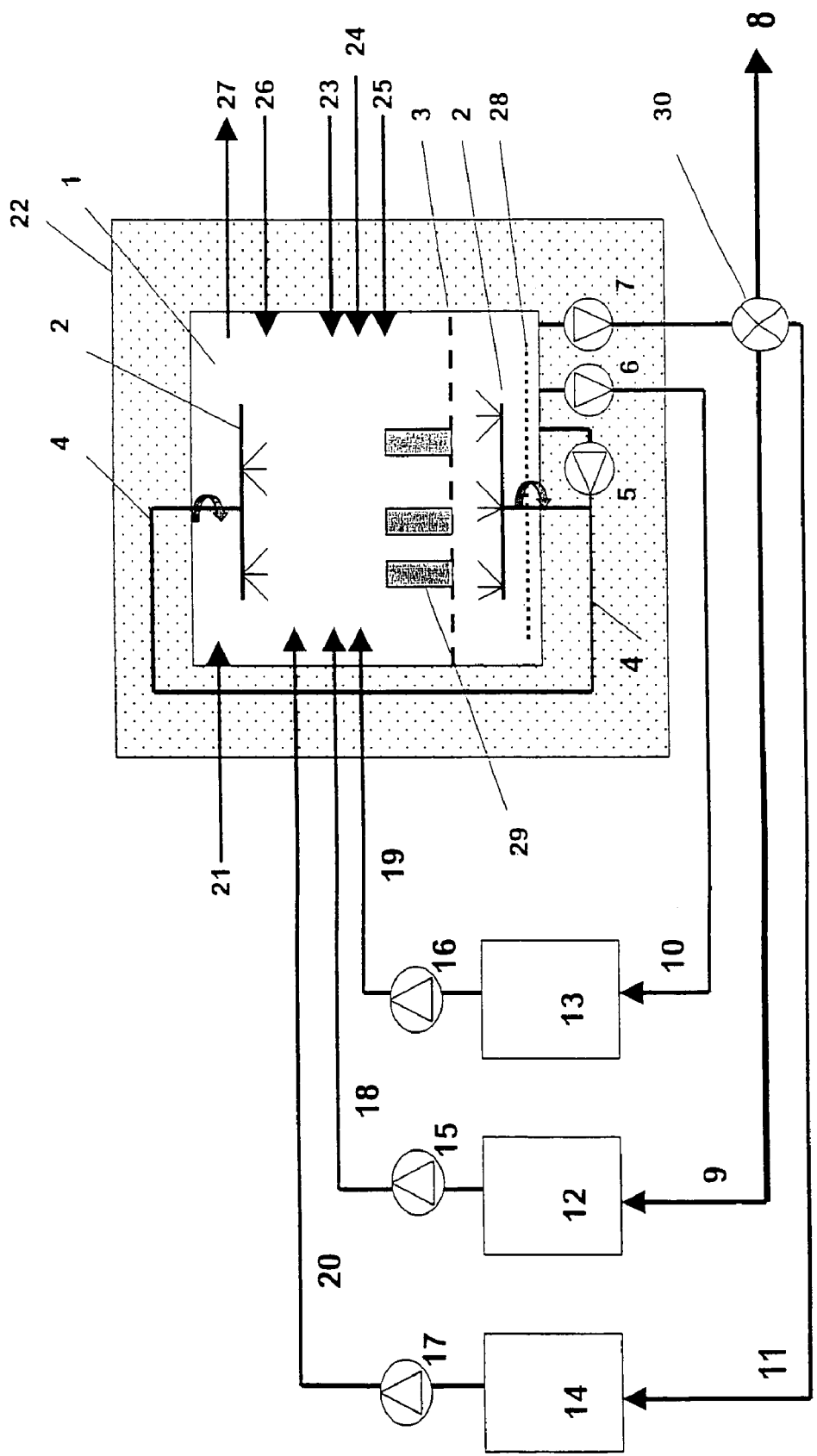
FIG. 1 is a schematic showing a rinse machine in accordance with the present invention.

The present invention improves strippability by first coating a work piece directly with at least one chromous and aluminiferous layer. Suitable coatings may include, but are not limited to, metallic AlCr, TiAlCr as well as other AlCr alloys, and/or the nitridic, carbidic, carbonitridic, boridic or nitroboridic hard-material compounds of the aluminum-chrome or other AlCr alloys. This type of coating, while extremely resistant to other conventional stripping methods, begins to peel off at approximately 5° C. when an alkaline solution containing a strong oxidant is applied. Thus, the coating can be rapidly and completely stripped or dissolved at ambient temperatures. Suitable oxidants include, but are not limited to, potassium permanganate, cerous ammonium nitrate, potassium peroxydisulphate or sodium peroxydisulphate This result is quite surprising in view of the fact that, by comparison, ternary titanium aluminum nitride coatings are difficult to strip. They require for example special complexing agents or an electrolytic process (as mentioned above), even though, in contrast to the chemically extremely resistant CrN, TiN will dissolve easily in a solution such as diluted hydrogen peroxide.

The coating may be composed of an essentially homogeneous single layer or of a multistratum sequence of individually aluminiferous and chromous layers. It will be desirable to select for each layer an Al content of at least 30% as an atomic percentage, otherwise the highly resistant CrN would predominate, thereby complicating the stripping process. The preferable maximum limit for the Al concentration is 80 atomic percent because during the coating process the deposition of nitridic AlCr layers relatively soft hexagonal phases are created in the range of 70–80 and because of their low mechanical strength are less suited to purposes regarding wear protection.

Coatings of that type can be stripped in a permanganate solution within a wide range of parameters. For example, if the coatings are to be removed from carbide surfaces that are excessively sensitive to alkaline substances, it will be sufficient for high permanganate concentrations of perhaps 20 to 50 g/L for a pH value of about 7 to strip the layers. As those skilled in the art know, the stripping process can be accelerated by adding complexing agents to the solution such as potassium-sodium-tartrate-tetrahydrate, sodium gluconate, EDTH, sulfonic-acid derivatives of aliphatic or aromatic hydrocarbons, derivatives of a carboxylated aromatic hydrocarbon (for instance of a phenol) and others, as well as inhibitors such as monocyclic or polynuclear nitrogenous heterocycles (e.g. morpholine, benzotriazole, etc.), amine borates, amine carboxylates, alkyl-aryl sulfonamides, fatty acid amides, amine- and sodium-neutralized phosphoric acid esters for protecting the sensitive substrate surface. In this case the stripping process will perform well at temperatures between 5 and 70° C.

For stripping work pieces immune to alkaline solutions, such as steel substrates and many other ferrous alloys, a higher pH range is recommended preferably between 9 and 14. In that case, a lower permanganate concentration will normally suffice, for example between 10 and 30 g/L, to completely strip AlCrN layers 2 to 10 µm thick at room temperature, i.e. approximately 15 to 30° C., within 15 to 60 minutes. Of course, here as well, increasing the permanganate concentration to above 30 g/L will speed up the stripping process even further. It does not matter if the AlCrN coating was applied on the work piece with a metallic intermediate layer or developed without a metallic intermediate layer.

During the stripping process, manganese dioxide is precipitated from the permanganate solution, which is why under certain circumstances it may be necessary after the stripping to remove $MnO_2$ residue from the surface of the work piece. This applies especially if and when the stripping is performed without the aid of one or several ultrasound generators. The cleaning is preferably performed in an aqueous solution to which a weak acid or a buffer solution in the acidic to slightly alkaline range has been added. The pH should be selected between 2 and 9, preferably between 3 and 7. As those skilled in the art know, this can be achieved for example by adding phosphoric acid, carbonic or hydroxycarbonic acid and especially by adding formic, acetic, oxalic, lactic, malic, tartaric or citric acid and/or the salts thereof.

Another advantage of the present invention is that it easily and quickly strips complex coatings as used on for example high-performance cutting materials or when tools and components must be employed at high temperatures, if the AlCr-containing layer directly deposited on the work piece is coated with one or several cover layers consisting of at least one hard-material compound. Examples of such coatings may include hard-substance compounds of the Periodic Table of Elements subgroups IV, V and VI (i.e. Ti, Zr, Hf, V, Nb, Ta; Cr, Mo, W) or aluminum and/or silicon as well as one or several nonmetals such as C, N, B, O. The AlCr-containing layer is attacked through the pores of the cover layer so that the cover layer above it is stripped off as well.

These coatings can be produced by both the PVD and the CVD process or a hybrid process combining the two coating techniques. Since the PVD process will always produce a certain number of pores, these processes are universally suitable and are preferred. For CVD layers the cover layer concerned needs to be selected along the criteria of a microporosity in such a fashion that the stripping solution can reach the AlCr-containing layer. This is obtained for instance with $Al_2O_3$ layers since the cooling process usually creates in them a pattern of fine fissures.

The substrates that can be stripped may be work pieces of a ceramic or metallic material including carbide, but are preferably work pieces made from steels or ferrous materials.

The following is a description of the present invention in terms of individual test results implementing the method of the present invention and comparative results using different stripping methods.

Using a Balzers model RCS industrial coating system referred to in European patent application number EP-1 186681 page 12, line 26 through page 14, line 9 and shown in FIGS. 3–6, AlCrN layers were produced by depositing Cr coatings containing different amounts of aluminum on various work pieces including test drills. The cleaned work pieces were mounted according to size on either a dual rotating substrate carrier or for diameters of less than 50 mm on triple rotating substrate carriers. Four powder-metallurgically produced targets of different AlCr alloys were installed in the cathodic arc sources that were placed on the walls of the coating system.

Next, radiant heaters positioned in the coating system heated the work pieces up to a temperature of about 450° C. The work-piece surface was etch-cleaned with Ar ions by applying a bias voltage of −100 to −200 V in an argon atmosphere at a pressure of 0.2 Pa.

This was followed by the precipitation of an AlCrN layer at a nitrogen pressure of 1 to 3 Pa and a substrate voltage of −50 V by operating four AlCr sources with an output of 3 kW over a period of 120 minutes. The process pressure for each of these steps can be set within a range from 0.5 to about 8 Pa. Either a pure nitrogen atmosphere or a mixture of nitrogen with an inert gas such as argon may be used for nitridic layers, or a mixture of nitrogen with a carbonaceous gas, with the addition of an inert gas if necessary, may be used for carbonitridic layers. Correspondingly, if oxygenous or boronic coatings have to be deposited, an oxygen- or respectively, a boron-containing gas may be added in conventional fashion.

Table 1 shows the composition of the targets, the crystal structure of the coating, the composition of the layer, the layer thickness, the layer hardness, the wear resistance and bonding strength as well as the substrate bias voltage and the process pressure.

For coatings in a transitional region with an Al content between 60 and 75 atomic percent it is possible to select via the process parameters not only the preferred orientation but the basic structure of the crystal lattice as well. Thus, for example, in Test B using a low pressure of 1 Pa and a substrate voltage of −50 V produces a hexagonal structure, whereas in Test A, using a pressure range of 3 Pa and a substrate voltage of −50V creates a cubic plane-centered structure.

TABLE 1

| Test Ref. | Al/Cr in Target | Crystal Structure | Al atom. % | Cr atom. % | Layer Thickness [μm] | HVO. 03 | $U_{subst.}$ [V] | $P_{N2}$ [Pa] |
|---|---|---|---|---|---|---|---|---|
| A | 3 | cub | 69.5 | 30.5 | 3.2 | 3100 | −50 | 3 |
| B | 3 | hex | 72.0 | 18.0 | 4.2 | 2100 | −50 | 1 |
| C | 1 | cub | 41.5 | 58.5 | 3.8 | 2800 | −50 | 3 |
| D | 0.33 | cub | 19.0 | 81.0 | 4.1 | 2300 | −50 | 3 |

For comparison purposes, the following strip tests were performed on the following, commercially available coating materials made by Balzers: Balinit A (TiN), Balinit C (WC/C with a Cr/CrC bonding layer), Balinit Futura Nano (TiAlN with a TiAl bonding layer), Balinit D (CrN), Balinit DLC (DLC with a Cr/CrC bonding layer).

EXAMPLE 1

In Tests A to D as referred to above, an aqueous solution containing 100 g/L NaOH (pH 14.4) and 20 g/L $KMnO_4$ as well as 10 g/L NaCl, used at room temperature, took about 15 to 35 minutes to strip steel drills and tools coated with AlCrN.

EXAMPLE 2

A solution containing 200 g/L NaOH (pH 14.7) and 5 g/L $KMnO_4$ took 2.5 hours to strip AlCrN-coated steel drills with a layer thickness of 3 μm; coating parameters as in Test D.

EXAMPLE 3

In a solution containing 200 g/L NaOH and 5 g/L $KMnO_4$, AlCrN-coated steel drills with a layer thickness of 3.5 μm were stripped at 60° C. within 35 to 50 minutes; coating parameters as in Tests A, B, C.

EXAMPLE 4

In a solution containing 20 g/L NaOH (pH 13.7) and 15 g/L $KMnO_4$ as well as 20 g/L sodium hydrogen carbonate and 20 g/L sodium carbonate, an AlCrN-coated steel drill with a layer thickness of 3 mm was stripped within 40 to 55 minutes; coating parameters as in Tests A, B, C.

EXAMPLE 5

Using an aqueous solution containing 20 g/L NaOH and 20 g/L $KMnO_4$ (pH 13.47) at a temperature of 20° C., AlCr/AlCrN-coated HSS drills (6 mm) with a layer thickness of 0.25 mm for AlCr, 3.71 mm for AlCrN, were completely stripped within 30 minutes.

EXAMPLE 6

For Example 6, two AlCr (70/30 and 50/50) and four TiAl (70/30 and 50/50) targets were installed in a coating system as described above. Next, along the parameters described under A and C, respectively, and using argon instead of nitrogen, the two AlCr targets deposited an AlCr layer about 0.3 mm thick on various work pieces. Then, as the final cover layer, a conventional Balinit Futura Nano layer (TiAlN) 4 to 5 mm thick was applied. These coatings as well were stripped using a solution per Example 1 within 30 to 60 minutes at room temperature.

EXAMPLE 7

In a coating system equipped with targets as in Example 6, an AlCrN layer 1 mm thick was applied, as a first step, without a metallic intermediate layer and employing parameters as described under A and C, respectively, again followed by a Balinit Futura Nano (TiAlN) cover layer 5 mm thick. Stripping with a solution per Example 1 at room temperature took 50 to 65 minutes.

EXAMPLE 8

This was aimed at determining the temperature dependence of the stripping process using a solution with 2% $KMNO_4$ and 2% NaOH (pH 13.46). HSS drills were stripped at room temperature and at 5° C., respectively. As expected, it was found that the stripping took longer at low temperature but still far less time than most conventional stripping methods. See Table 2 below for details.

TABLE 2

| Temp. (° C.) | $t_{stripping}$ (min.) | $th_{initial}$ (µm) | $th_{10min}$ (µm) | $th_{20min}$ (µm) | $th_{30min}$ (µm) | $th_{40min}$ (µm) |
|---|---|---|---|---|---|---|
| 19 | 20 | 2.40 | 1.65 | 0 | 0 | 0 |
| 19 | 20 | 2.40 | 1.45 | 0 | 0 | 0 |
| 5 | 40.0 | 2.40 | 1.95 | 1.65 | 1.25 | 0.1 |

The following are comparative examples that illustrate the disadvantages of other stripping methods.

EXAMPLE 9

A DLC coat (Balinit DLC) 2 mm thick, deposited with a 0.3 mm Cr intermediate layer, was stripped off a steel drill in a permanganate solution as described in Example 1, in approximately 3 hours.

EXAMPLE 10

In a solution containing 200 g/L cerous ammonium nitrate and 32.5 g/L acetic acid, drills of different steels coated with AlCrN were stripped within 2 hours. However, depending on the type of steel, corrosive damage was detected on part of the surface.

EXAMPLE 11

Using a solution as in Example 5, an attempt was made to strip the following layers off 6 mm HSS drills at 20° C.: Balinit A (TiN), layer thickness 5.1 mm; Balinit C (Cr/CrC/WC/C), layer thickness 1.4 mm for WC/C, 0.5 mm for Cr/CrC bonding layer; Balinit Futura Nano (TiAlN with a thin TiAl bonding layer), total layer thickness 4.4 mm; Balinit D (Cr/CrN), layer thickness 0.5 mm for Cr, 3.2 mm for CrN. Unlike the AlCrN coating in Example 5, none of the coatings could be stripped fast enough to meet industrial manufacturing requirements. Even after 8 hours, none of the drills revealed any bared base material. Drills coated with Balinit A showed no stripping effect even after 10.5 hours. For Balinit Futura Nano only one tenth of a mm was ablated after 10.5 hours, while drills coated with Balinit C, although with a completely stripped base surface and phase after 10.5 hours, revealed only about a 50% removal of the material from the flute. Only the relatively thin Balinit C layers could be completely stripped after about 9 hours.

EXAMPLE 12

A TiN/TiAlN-coated hob cutter with a total layer thickness of about 6 mm (TiAl about 0.3 mm) and test pieces with various layer thicknesses were treated in an alkaline 30% $H_2O_2$ solution, pH 14.2, at 30° C. with the addition of a potassium-sodium tartrate, a fluoric tenside and other reagents analogous to those in Example 2 of DE 4339502. It took 24 hours to strip the substrate surface of the test pieces with a layer thickness of 2.2 mm, although thicker coatings as well revealed a distinctly reduced layer thickness. The hob cutter took a full 48 hours to strip completely. In view of the well-known high reactivity of this type of solution it is necessary to take additional safety precautions such as rapid rinsing, rapid cooling or similar measures.

To remove adhering manganese dioxide residue after stripping, the stripped tools with pyrolusite remnants were each immersed in an aqueous solution for 10 minutes and at a temperature of 20° C. As shown in Table 3 below, particularly suitable cleaning agents are mildly acid solutions with a pH value of between 3.5 and 7, because in that range the residue separates well without damage to the steel surface of the work piece. For particularly sensitive carbides it will always be desirable to add an inhibitor to prevent the cleaning solution from causing corrosive damage.

Test M was performed with the aid of ultrasound. Deconex 29 AC is an industrial, lactic acid-based detergent that additionally contains inhibitors (especially benzotriazole) for protecting the metal surfaces, thus avoiding surface damage at the higher acidity level. After traditional rinsing and drying, work pieces thus cleaned can go straight into a PVD or CVD coating system for recoating. If necessary, a microblasting process may be added to smoothen any differences in the surface finish that may be due to the use of the tools after the first or a preceding coating process. The result will be similar when the temperature of the cleaning solution is raised to 50° C. and the treatment time is reduced to 2 minutes, although in Tests K and L as well the steel substrate exhibited slight damage.

TABLE 3

| Test Ref. | Recipe | pH | Manganese Dioxide Removal | Damage to Steel (QRS) |
|---|---|---|---|---|
| E | 1% oxalic acid | 1.6 | rapid | major |
| F | 1% oxalic acid + NaOH | 3.15 | rapid | major |
| G | 1% oxalic acid + 1% NaAc + 1% Ac | 3.75 | OK | minor |
| H | 1% oxalic acid + 1% NaAc + 1% Ac + NaOH | 6.9 | slow | none |
| I | 25% $H_3PO_4$ (85%) | 0.5 | rapid | major |
| J | 20% Deconex 33 SP | 0.9 | slow | major |
| K | 1% $K_2S_2O_5$ + 1% $NaHCO_3$ + 1% $Na_2CO_3$ | 7 | OK | none |
| L | 1% $K_2S_2O_5$ + 1% $NaHCO_3$ + 1% $Na_2CO_3$ + NaOH | 9 | slow | none |
| M | 2% Deconex 29 AC | 2 | OK | none |

Cleaning solutions such as those used in Tests H, K and M per Table 3 are preferred over the hydrogen peroxide-based solutions traditionally employed for removing manganese dioxide since they do not require any additional safety precautions such as those mentioned in Example 12. It should be mentioned that another hydrogen peroxide-based recipe: $H_2O_2$ 35 having a pH value of approximately 3 to 8 has a cleaning of about 5 minutes at room temperature.

As a particular advantage, this method may be used in single-compartment systems such as for cleaning purposes only, since no highly aggressive or hard-to-control chemicals need to be employed thus obviating the need for expensive special materials in building the compartment and associated accessories or for special measures such as rapid rinsing, rapid cooling, pressure-type collecting basins or the like. This type of single-compartment system can be operated at considerably lower cost than conventional stripping systems. The compartment can be used for various pre- and/or post-processing steps, including cleaning processes as well as the stripping operation proper, thus eliminating the pre- or post-processing in additional cleaning systems perhaps otherwise needed. Compared to typical conventional multi-basin systems with an automatic transfer unit, this system offers the advantage of a smaller, space-saving footprint.

A typical example of the workflow applying the method in accordance with the present invention will now be described. Referring to FIG. 1 and Table 4, FIG. 1 shows a schematic of a rinsing machine 22 having a single compartment system according to the present invention and Table 4 summarizes the procedural steps.

TABLE 4

| Process | Action | Medium | Conc'n | Dispns. (1) | Duration | Spray Yes/No | Temp [° C.] |
|---|---|---|---|---|---|---|---|
| Pre-clean | Add from buffer 1, circulating pump on | Deconex HT1153/ HT1054 | 3%/2% | 13 | 40 sec | Yes | RT |
| | Circulating pump & heat on | | | | 180 sec | Yes | 30–55 |
| | Pump down in buffer 2 | | | | 45 sec | No | RT |
| Fine Clean | Add via dispenser 3 | Decon.HT 1015 | 100% | 0.01 | 5 sec | No | RT |
| | Dist water in, circulating pump on | Dist Water | | 13 | 40 sec | Yes | RT |
| | Circ.pump & heat on | | | | 180 sec | Yes | 30–55 |
| | Pump down | | | | 45 sec | No | RT |
| Strip | Add from buffer 3, circulating pump on | KMnO$_4$/ NaOH | 2%/2% | 13 | 40 sec | Yes | RT |
| | Circulating pump on | | | | 10–40 min | Yes | RT |
| | Return pump in buffer 3 | | | | 40 sec | No | RT |
| Intermediate Rinse | Dist water in, pump down | Dist water | | Pump in/down | 35 sec | No | RT |
| MnO$_2$ Removal | Add from buffer 1, circulating pump on | Citric acid + DMEA | 5% | 13 | 40 sec | Yes | RT |
| | Circulating pump on | | | | 1 min. | Yes | 20–55 |
| | Return pump in buffer 1 | | | | 40 sec | No | RT |
| Intermediate Rinse | Dist water in, pump down | Dist water | | Pump in/down | 35 sec | No | RT |
| Alkaline Rinse | Add via dispenser 1. Dist water in, circulating pump on | NaOH | 30% | 0.12 | 60 sec | No | RT |
| | | Dist. water | | 13 | 90 sec | Yes | RT |
| | Circulating pump on | | | | 2 min. | Yes | RT |
| | Pump down | | | | 45 sec | No | RT |
| Rinse w/ anticorrossion agent I | Add via met. dispenser 2 | DMEA | 100% | 0.04 | 20 sec | | RT |
| | Dist water in Circulating pump on | Distilled water | | 13 | 90 sec | Yes | RT |
| | Circulating pump & heat on | | | | 150 | Yes | 25–55 |
| | Pump down | | | | 45 | No | RT |
| Rinse w/ anticorrossion agent II | Add via met. dispenser 2 | DMEA | 100% | 0.04 | 20 sec | | RT |
| | Dist water in Circulating pump on | Distilled water | | 13 | 90 sec | Yes | RT |
| | Circulating pump & heat on | | | | 150 | Yes | 25–55 |
| | Pump down | | | | 45 | No | RT |
| Drying | | Hot air | | | 40 | No | 80–120 |

After a coated work piece 29 is loaded on a holder such as a loading grate 3 and the spray chamber 1 is closed, different procedural steps can now be performed. It should be noted that the spray chamber 1 may any size known in the art. In example illustrated the spray chamber 1 is approximately 125 liters. First, the work pieces 29 are pre-cleaned where a first container 12 supplies, via a first intake pump 15 and a first feed line 18, a first aqueous cleaning solution containing 3% of a first industrial cleaner as well as 2% of a second industrial cleaner. At the same time a spray cycle comprising rotary sprayers 2, a circulating line 4, and a circulating pump 5. The circulating pump 5 is activated thereby evenly distributing the cleaning solution on the work pieces 29 through the circulation line 4 and rotary sprayers 2. Next, the temperature of the cleaning solution is raised to 55° C. for three minutes and the spraying is continued. Upon completion of the pre-cleaning the first cleaning solution is pumped back into the container 12 via a multiway valve 30 and a first return line 9. Next, a fine cleaning is performed similar to that of the pre-cleaning. For the fine cleaning, deionized water is added via the intake 21 and a third industrial cleaner is added via a first metering dispenser 23. The solution is evenly distributed on the work pieces 29 through the spray cycle 2, 3, 5 as described above. The solution is temperature-equalized and is subsequently discharged via a discharge pump 7, the multiway valve 30 and the drain pipe 8 into a collector basin. The first cleaner used in the precleaning is an amine-based industrial cleaner, whereas the second cleaner consists of a mixture of phosphate, silicate and acetate. The third industrial cleaner employed in the fine cleaning consists of potassium hydroxide with acetate added.

The stripping step is performed with 2% solution of potassium permanganate and corresponding caustic soda lye. A second container 13 adds the solution via a second pump 16 and a second feed line 19. The work pieces 29 are treated for 10 to 40 minutes depending on layer thickness by activating the spray cycle 2, 4, 5. The solution is then fed back into the container 13 via the return pump 6 and the second return line 10.

Following an intermediate rinsing with distilled water, the next procedural step removes any remaining manganese dioxide residue. A 5% aqueous citric acid solution, preferably also containing an anti-corrosion substance such as amine-based morpholine, is fed from a third container 14 through a third intake pump 17 and a third feed line 20. After rotary spraying and application of the citric acid solution the solution is fed back to the container 14 via the discharge pump 7, the multiway valve 30 and a third return line 11. Following a rinsing with distilled water, an alkaline cleaning comprising deionized water, added via the intake 21 and caustic soda lye, added via a second metering dispenser 24 is circulated and discharged. Intermediate rinsing as described above may also be performed between other procedural steps to eliminate interfering impurities stemming from a preceding procedural step. For that reason it is also desirable to keep the drain lines leading from the spray chamber to the pumps 5, 6 and 7 as short as possible.

To reliably protect the work pieces 29 from corrosion during the final drying process and possible intermediate storage, distilled water is added twice via intake 21 and an amine-based anticorrosion agent via a third metering dispenser 25. The mixture is heated to a temperature of between 25 and 55° C. and the work pieces 29 are passed through the spray cycle. The anticorrosion solution is then drained via the discharge pump 7, the multiway valve 30 and the drain pipe 8.

Finally, the work pieces 29 are dried in a hot-air circulating system 26, 27, shown as a block outline only. The individual procedural steps are preferably coordinated in conventional fashion by means of a process control system.

Thus treated, the work pieces are fully stripped and generally ready without further preprocessing for being recoated in a vacuum coating system. If necessary, the coating may be preceded or followed by additional surface-finishing steps such as microblasting with corundum or silicon carbide, glass beads or the like.

The method described lends itself particularly well to application on essentially cylindrical work pieces such as gear-hobbing and end-milling cutters, ball-head and other milling tools. For processing small items it is possible for instance to employ several stacked loading grates or one or several rotary drums.

The effectiveness and/or contamination of the individual chemicals can be monitored by appropriate sensors installed in locations such as the containers 12, 13, 14, the feed lines 18, 19, 20, return lines 9, 10 and the spray chamber 1 so that for example when a certain metal ion concentration is exceeded or the cleaning or stripping reagents show inadequate activity, an alarm is triggered or one or several of the process solutions is/are automatically replaced.

In principle, single-compartment systems of the type described are suitable for use with other stripping methods as long as properly controllable chemical processes are employed similar to that for stripping AlCr-based layers or the necessary safety devices as referred to above and/or highly corrosion-resistant materials are used for individual work pieces or for the entire single-compartment system.

What is claimed is:

1. A method for stripping a coating off a ceramic or metallic work piece to improve strippability comprising the steps of:
    applying at least a first chromous and aluminiferous coat directly on the work piece; and,
    stripping said first coat from the work piece with an alkaline solution comprising a strong oxidant selected from the group consisting of potassium permanganate, cerous ammonium nitrate, potassium peroxydisulphate, sodium peroxydisulphate and mixtures thereof.

2. The method of claim 1, wherein the coating is deposited by a PVD or CVD process.

3. The method of claim 1, wherein at least one coating comprises at least one material selected from the group consisting of: metallic AlCr, TiAlCr and nitridic, carbidic, carbonitridic, boridic or nitridoboridic hard-material compounds of aluminum chrome.

4. The method of claim 1, wherein the chromium component in the metal content of the coating is in the range of 20 and 70 atomic %.

5. The method of claim 1, wherein the aluminum component in the metal content of the coating is in the range of 30 and 80 atomic %.

6. The method as in claim 1 further comprising the step of:
    applying at least one cover layer comprising at least one hard-material compound to the at least first coating, wherein the hard-material compound comprises at least one metal and at least one nonmetal, wherein the metal comprises at least one of the elements of subgroups IV, V or VI of the periodic table of elements.

7. The method of claim 1, wherein the pH value of the alkaline solution is in a range between 7 and 15, said alkaline solution comprising 1 to 50 g/L permanganate.

8. The method of claim 1 further comprising the step of:
    cleaning the work piece in an aqueous solution for the removal of any manganese dioxide residue that may have precipitated from permanganate present in said alkaline solution and remained on the work piece surface.

9. The method of claim 1, wherein the work piece is stripped in a single-compartment system, with at least one additional processing step being performed in said single-compartment system.

10. The method of claim 1, wherein the pH value of the alkaline solution is higher than 9.

11. The method of claim 3, wherein the minimum of one coating is composed of a sequence of strata that individually comprise at least one of the said materials.

12. The method as in claim 3 further comprising the step of:
    applying at least one cover layer comprising at least one hard-material compound to the at least first coating, wherein the hard-material compound comprises at least one metal and at least one nonmetal, wherein the metal comprises at least one of the elements of subgroups IV, V or VI of the periodic table of elements.

13. The method of claim 6 wherein the metal comprises: Ti, Zr, Hf; V, Nb, Ta; Cr, Mo, W, aluminum or Si and wherein the nonmetal comprises C, N, B or O.

14. The method of claim 7, wherein the stripping temperature of the permanganate solution is maintained at between 0 and 30° C.

15. The method of claim 8 wherein the pH value of the aqueous solution ranges between 2 and 9.

16. The method of claim 8, wherein the pH value of the aqueous solution ranges between 3.5 and 7.

17. The method of claim 9, wherein the at least one additional processing step comprises: at least one cleaning cycle, at least one rinsing cycle or a combination of at least one cleaning and rinsing cycle.

18. The method as specified in claim 9 wherein the additional processing step includes a final drying of the work pieces.

19. The method as in claim 11 further comprising the step of:
applying at least one cover layer comprising at least one hard-material compound to the at least first coating, wherein the hard-material compound comprises at least one metal and at least one nonmetal, wherein the metal comprises at least one of the elements of subgroups IV, V or VI of the periodic table of elements.

20. The method of claim 12 wherein the metal comprises: Ti, Zr, Hf; V, Nb, Ta; Cr, Mo, W, aluminum or Si and wherein the nonmetal comprises C, N, B or O.

21. The method of claim 15, wherein the aqueous solution comprises: phosphoric acid, a carbonic acid or a hydroxycarbonic acid.

22. The method of claim 17, wherein the cleaning cycle includes at least one pre-cleaning operation and subsequently at least one fine cleaning operation for removing any residue left on the surface of said work piece following said pre-cleaning operation.

23. The method of claim 17, wherein the rinsing cycle includes at least one of an alkaline rinse and a rinse with an anticorrosion agent.

24. The method of claim 19 wherein the metal comprises: Ti, Zr, Hf; V, Nb, Ta; Cr, Mo, W, aluminum or Si and wherein the nonmetal comprises C, N, B or O.

25. The method of claim 21, wherein at least one of the alkaline solution and the aqueous solution includes an inhibitor for protecting the surface of the work piece against corrosion.

26. A method for stripping a coating off a ceramic or metallic work piece to improve strippability comprising the steps of:
applying at least a first chromous and aluminiferous coat directly on the work piece; and,
stripping said first coat the work piece with an alkaline solution comprising a strong oxidant in a single-compartment system with at least one additional processing step being performed in the single-compartment system, said strong oxidant being selected from the group consisting of potassium permanganate, cerous ammonium nitrate, potassium peroxydisulphate, sodium peroxydisulphate and mixtures thereof.

27. The method of claim 26 wherein the at least one additional processing step comprises: at least one cleaning cycle, at least one rinsing cycle or a combination of at least one cleaning and rinsing cycle.

28. The method as specified in claims 26 wherein the additional processing step includes a final drying of the work pieces.

29. The method of claim 27, wherein the cleaning cycle includes at least one precleaning operation and subsequently at least one fine cleaning operation for removing any residue left on the surface of said work piece following said precleaning operation.

30. The method of claim 27, wherein the rinsing cycle includes at least one of an alkaline rinse and a rinse with an anticorrosion agent.

* * * * *